US009934830B2

(12) United States Patent
Park et al.

(10) Patent No.: US 9,934,830 B2
(45) Date of Patent: Apr. 3, 2018

(54) MULTI-COMMUNICATION DEVICE IN A MEMORY SYSTEM

(71) Applicant: SAMSUNG ELECTRONICS CO., LTD., Suwon-si, Gyeonggi-do (KR)

(72) Inventors: Jongmin Park, Busan (KR); Tae-Kyeong Ko, Hwaseong-si (KR); Do-Han Kim, Hwaseong-si (KR); Sungup Moon, Seoul (KR); Kyoyeon Won, Hwaseong-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/298,335

(22) Filed: Oct. 20, 2016

(65) Prior Publication Data

US 2017/0140798 A1  May 18, 2017

(30) Foreign Application Priority Data

Nov. 18, 2015  (KR) .................. 10-2015-0161945

(51) Int. Cl.
*G11C 7/00* (2006.01)
*G11C 7/10* (2006.01)
*G11C 7/22* (2006.01)
*G11C 7/02* (2006.01)

(52) U.S. Cl.
CPC .............. *G11C 7/1012* (2013.01); *G11C 7/02* (2013.01); *G11C 7/22* (2013.01)

(58) Field of Classification Search
CPC ..... G11C 11/4093; G11C 5/063; G11C 7/222; G11C 11/4076; G11C 5/066; G11C 7/02
See application file for complete search history.

(56) References Cited

U.S. PATENT DOCUMENTS

| 6,496,445 | B2 | 12/2002 | Lee |
| 7,356,568 | B2 | 4/2008 | Arimilli et al. |
| 7,941,056 | B2 | 5/2011 | Baker et al. |
| 2003/0071668 | A1* | 4/2003 | Starr .................... H03L 7/0891 327/157 |
| 2004/0236978 | A1 | 11/2004 | Yoon |
| 2008/0133817 | A1 | 6/2008 | Brandt et al. |
| 2008/0177923 | A1 | 7/2008 | Klein |
| 2014/0101370 | A1 | 4/2014 | Chu et al. |
| 2015/0081989 | A1 | 3/2015 | Lee et al. |
| 2015/0185812 | A1 | 7/2015 | Hyun et al. |
| 2015/0242313 | A1 | 8/2015 | Lee et al. |
| 2016/0043802 | A1* | 2/2016 | Suh .................... G02B 6/12007 398/141 |

FOREIGN PATENT DOCUMENTS

| KR | 10-1069638 | 9/2011 |
| KR | 10-1080498 | 10/2011 |
| KR | 1020140063660 | 5/2014 |
| KR | 10-1429183 | 8/2014 |
| KR | 1020150031400 | 3/2015 |
| KR | 1020150077785 | 7/2015 |

* cited by examiner

*Primary Examiner* — Hien Nguyen
(74) *Attorney, Agent, or Firm* — F. Chau & Associates, LLC

(57) ABSTRACT

In a memory module including a memory device and a filter, the memory device operates with a clock of a reference frequency. The filter receives a multiplexed signal from a host and filters a signal of a frequency band from the multiplexed signal. The frequency band includes the reference frequency and the signal of the frequency band is provided to the memory device.

15 Claims, 10 Drawing Sheets

MULTI-COMMUNICATION DEVICE IN A MEMORY SYSTEM

CROSS-REFERENCE TO RELATED APPLICATION

This U.S. application claims priority under 35 U.S.C. § 119 to Korean Patent Application No. 10-2015-0161945, filed on Nov. 18, 2015, in the Korean Intellectual Property Office, the disclosure of which is incorporated by reference herein in its entirety.

TECHNICAL FIELD

Exemplary embodiments of the inventive concept described herein relate generally to memory modules, and in particular, to a multi-communication memory module in a memory system.

DISCUSSION OF RELATED ART

The data transfer rate of a data bus increases as operating speeds of a computer processor and memory increase. This increase in the data transfer rate also causes an increase in signal noise at a connection point where a memory controller and a memory device are connected to the data bus. Furthermore, because a conventional semiconductor memory device is unable to transfer two or more commands at the same time, data processing time increases when the memory device has to process a huge amount of data.

In addition, with regard to the data bus, electrical characteristics such as capacitance and inductance become an issue. For example, at high speeds, a conventional bus arrangement may cause signal distortion, noise, delay, and other spurious signal phenomena. Consequently, even though operating speed of memory may increase, the reliability of the data transfer cannot be ensured.

Exemplary embodiments of the inventive concept may provide a multi-communication memory module with a memory bus structure and communication method that enables reliable high-speed (e.g., 1 GHz or more) operation where signal distortion, noise, and other issues may be removed or reduced.

SUMMARY

An exemplary embodiment of the inventive concept is directed to a memory module. The memory module may include a memory device and a filter. The memory device may operate with a clock of a reference frequency. The filter may receive a multiplexed signal from a host and may filter a signal of a frequency band from the multiplexed signal. The frequency band includes the reference frequency and the signal of the frequency band is provided to the memory device.

An exemplary embodiment of the inventive concept is directed to a memory module which includes a first memory device, a second memory device, a first filter, and a second filter. The first memory device may operate with a clock of a first reference frequency. The second memory device may operate with a clock of a second reference frequency that is different from the first reference frequency. The first filter may receive a multiplexed signal from a host and may filter a signal of a first frequency band, which includes the first reference frequency, from the multiplexed signal. The second filter may receive the multiplexed signal from the host and may filter a signal of a second frequency band, which includes the second reference frequency, from the multiplexed signal. The signal of the first frequency band may be provided to the first memory device and the signal of the second frequency band may be provided to the second memory device.

An exemplary embodiment of the inventive concept is directed to a method of operating a data processing device. The method may include: sending a plurality of signals from a host to a plurality of memory modules via a data bus; filtering the plurality of signals to pass a first filtered signal that corresponds to a first frequency band of a first memory module among the plurality of memory modules; filtering the plurality of signals to pass a second filtered signal that corresponds to a second frequency band of a second memory module among the plurality of memory modules; passing the first filtered signal to a first memory device of the first memory module; and passing the second filtered signal to a second memory device of the second memory module. The first frequency band and the second frequency band may be different.

BRIEF DESCRIPTION OF THE DRAWINGS

The above and other features will become more clearly understood by describing in detail exemplary embodiments thereof with reference to the accompanying drawings.

DETAILED DESCRIPTION

Various exemplary embodiments of the inventive concept will be described more fully hereinafter with reference to the accompanying drawings. It should be understood that the present inventive concept may, however, be embodied in many different forms and should not be construed as limited to the exemplary embodiments set forth herein. Like numerals may refer to like elements throughout.

In an exemplary embodiment of the inventive concept, frequency division multiplexing (FDM) may be used to transfer signals between a host and a plurality of memory modules at high speed. In communications using frequency division multiplexing, data may be divided into channels of different frequency bands. The divided data may be converted into a carrier signal of a corresponding frequency band for transmission. Through frequency division multiplexing, the host may be able to communicate with the plurality of memory modules at the same time.

Figure 1:
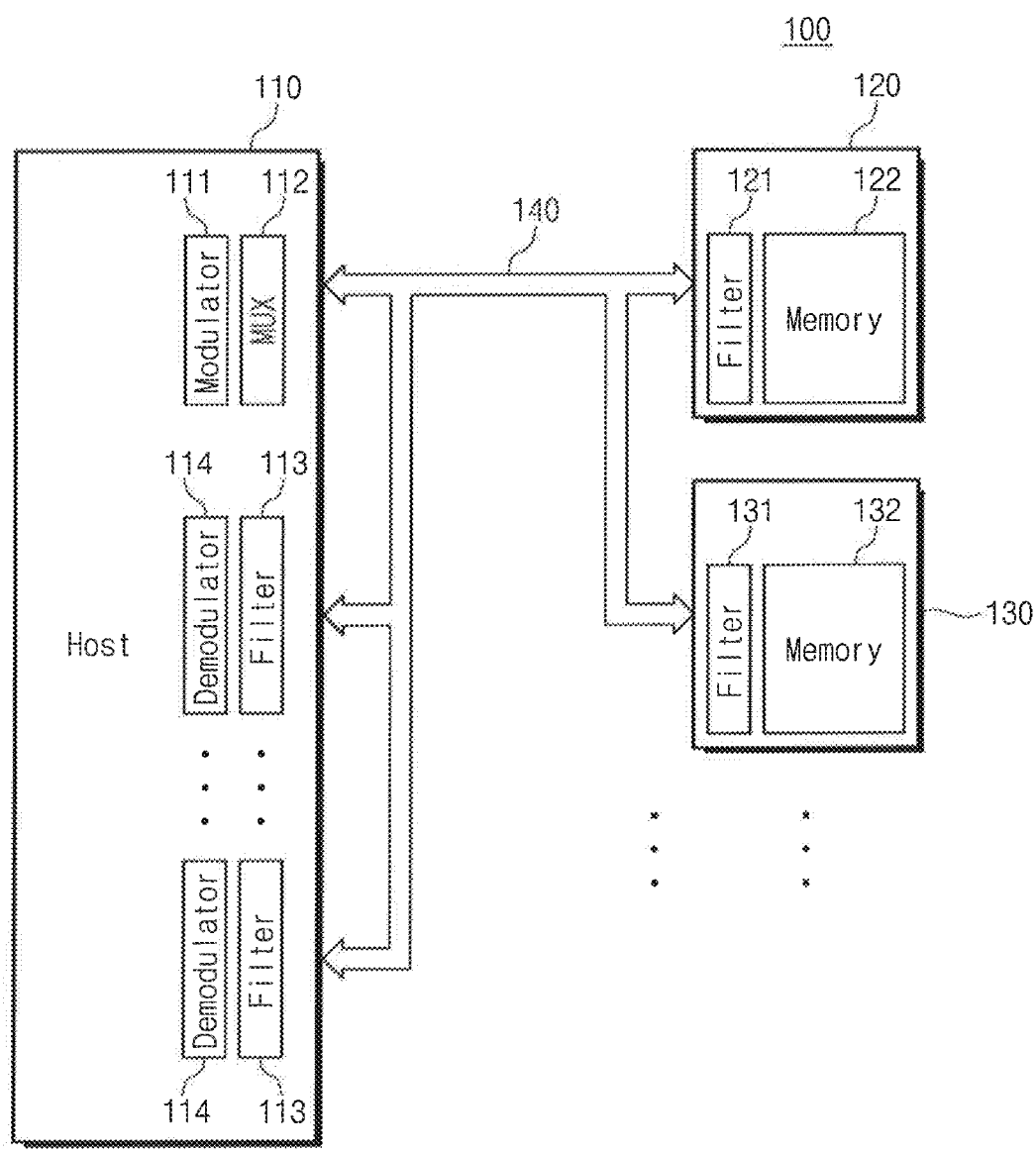
FIG. 1 is a block diagram illustrating a data processing device according to an exemplary embodiment of the inventive concept.

FIG. 1 is a block diagram illustrating a data processing device according to an exemplary embodiment of the inventive concept. Referring to FIG. 1, a data processing device 100 may include a host 110, a first memory module 120, a second memory module 130, and a data bus 140.

The host 110 may include a modulator 111, a multiplexer 112, a filter 113, and a demodulator 114. The host 110 may be connected with the first and second memory modules 120 and 130 through the data bus 140.

The modulator 111 may be connected with the multiplexer 112. The modulator 111 may modulate information, which is to be provided to the first and second memory modules 120 and 130, to a signal of an operating frequency band of each of the first and second memory modules 120 and 130. The modulated signal may be provided to the multiplexer 112.

The multiplexer 112 may be connected with the data bus 140. The multiplexer 112 may combine discrete signals into one signal to be provided to one channel. The multiplexer 112 may transmit signal(s) from the modulator 111 to the data bus 140 through multiplexing.

Filters 113 may be connected with the data bus 140. Each of the filters 113 may pass a signal, which has an operating frequency band corresponding to each of the first and second memory modules 120 and 130, from either the first and second memory modules 120 and 130. In other words, each of the filters 113 may demultiplex signals provided from the first and second memory modules 120 and 130. In an exemplary embodiment of the inventive concept, each of the filters 113 may be at least one of a low pass filter, a band pass filter, a high pass filter, or a band reject filter.

Demodulators 114 may be connected respectively with the filters 113. Each of the demodulators 114 may extract an original signal from a modulated signal, which includes information to be provided. In other words, each of the demodulators 114 may be reverse an operation of the modulator 111. The demodulators 114 may demodulate signals from the first and second memory modules 120 and 130 into signals that have a bandwidth able to be processed by the host 110.

The first memory module 120 may be connected with the host 110 and the second memory module 130 through the data bus 140. The first memory module 120 may include a filter 121 and a memory device 122.

The second memory module 130 may include a filter 131 and a memory device 132. The second memory module 130 may be connected with the first memory module 120 and the host 110 through the data bus 140. The second memory module 130 may operate in a similar manner as the first memory module 120, which will be described below.

The filter 121 may be connected with the memory device 122 and the data bus 140. The filter 121 may pass a signal, which has an operating frequency band corresponding to the first memory module 120, from among a plurality of signals provided from the host 110. In an exemplary embodiment of the inventive concept, the filter 121 may be at least one of a low pass filter, a band pass filter, a high pass filter, or a band reject filter. In an exemplary embodiment of the inventive concept, the filter 121 may be embedded in the memory device 122. In an exemplary embodiment of the inventive concept, the filter 121 may be implemented with passive elements on the outside of the memory device 122.

The memory device 122 may be controlled by a signal of the host 110 provided through the filter 121. The memory device 122 may include a volatile memory or a nonvolatile memory.

The volatile memory may include a dynamic random access memory (DRAM), a static random access memory (SRAM), a thyristor RAM (TRAM), a zero capacitor RAM (Z-RAM), a twin transistor RAM (TTRAM), or a magnetoresistive RAM (MRAM).

The nonvolatile memory may be an electrically erasable programmable read-only memory (EEPROM), a flash memory, a magnetic RAM (MRAM), a spin-transfer torque MRAM (STT-MRAM), a conductive bridging RAM (CBRAM), a ferroelectric RAM (FeRAM), a phase change RAM (PRAM), a resistive RAM (RRAM), a nanotube RRAM (RRAM), a polymer RAM (PoRAM), a nano-floating gate memory (NFGM), a holographic memory, a molecular electronic memory device, or an insulator resistance change memory. One or more bits may be stored in a unit cell of the nonvolatile memory.

The first memory module 120 may operate as follows. First, the filter 121 may be provided with a plurality of signals from the host 110. The filter 121 may pass a signal, if it corresponds to a frequency band of the first memory module 120, from among the plurality of signals, and the filter 121 may include information about various frequency bands. The signal passing through the filter 121 may be provided to the memory device 122. In other words, the signal passing through the filter 121 may be a signal which targets the first memory module 120. Afterwards, the memory device 122 may be controlled by the signal passing through the filter 121. The memory device 122 may provide desired data to the filter 121 in synchronization with signals from the host 110. Signals passing through the filter 121 from the memory device 122 may be provided to the data bus 140.

In an exemplary embodiment of the inventive concept, the first memory module 120 may have a registered dual in-line memory module (RDIMM) structure. Furthermore, the first memory module 120 may have various DIMM structures depending on the type and usage of the memory device 122.

For example, in the case where the memory device 122 is a volatile memory, the first memory module 120 may be implemented as one of an unbuffered DIMM (UDIMM), a registered DIMM (RDIMM), or a load reduced DIMM (LRDIMM). In the exemplary embodiments of the inventive concept described below, where the memory device 122 includes volatile memory, the volatile memory is exemplified as DRAM. However, the memory device 122 may be any one of the above-described volatile memories.

FIGS. 2 to 6 are block diagrams illustrating a memory module of FIG. 1 according to various exemplary embodiments of the inventive concept.

Figure 2:
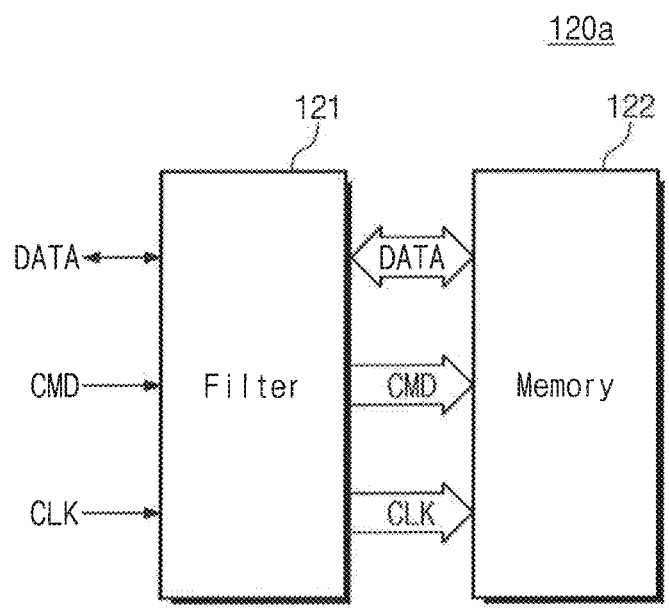
FIGS. 2 to 6 are block diagrams illustrating a memory module of FIG. 1 according to various exemplary embodiments of the inventive concept.
Figure 3:
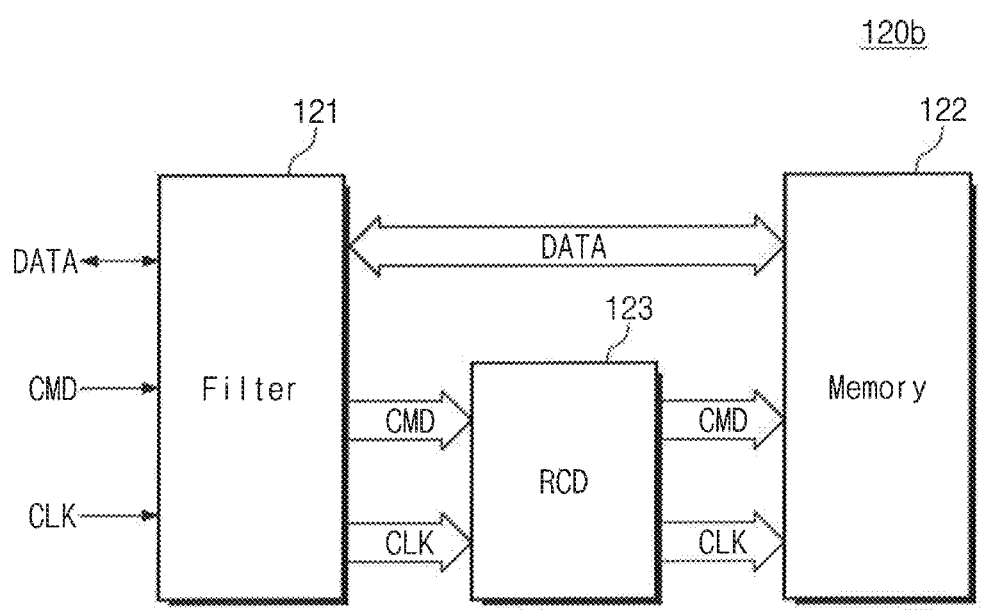
Figure 4:
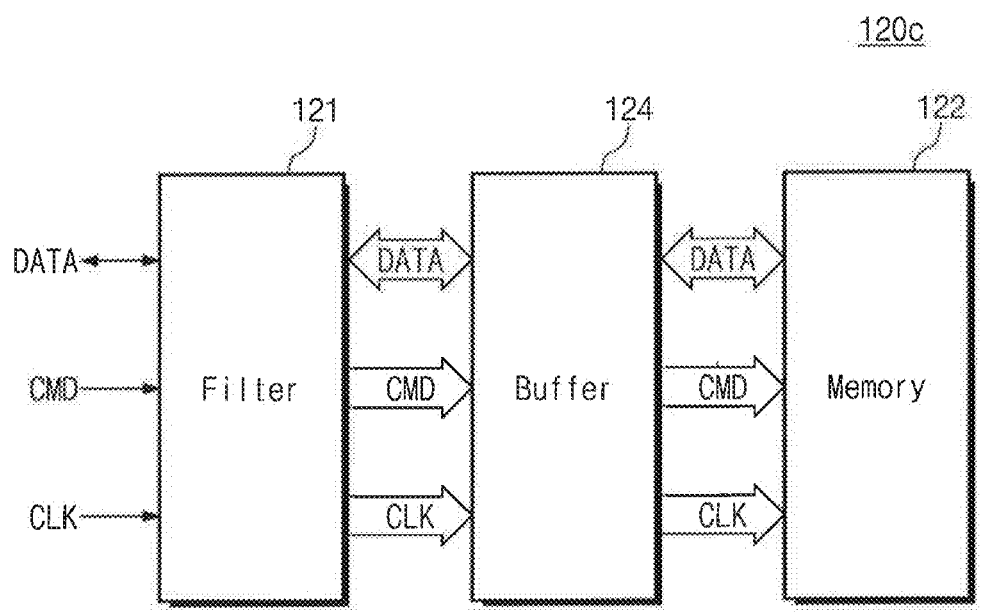
Figure 5:
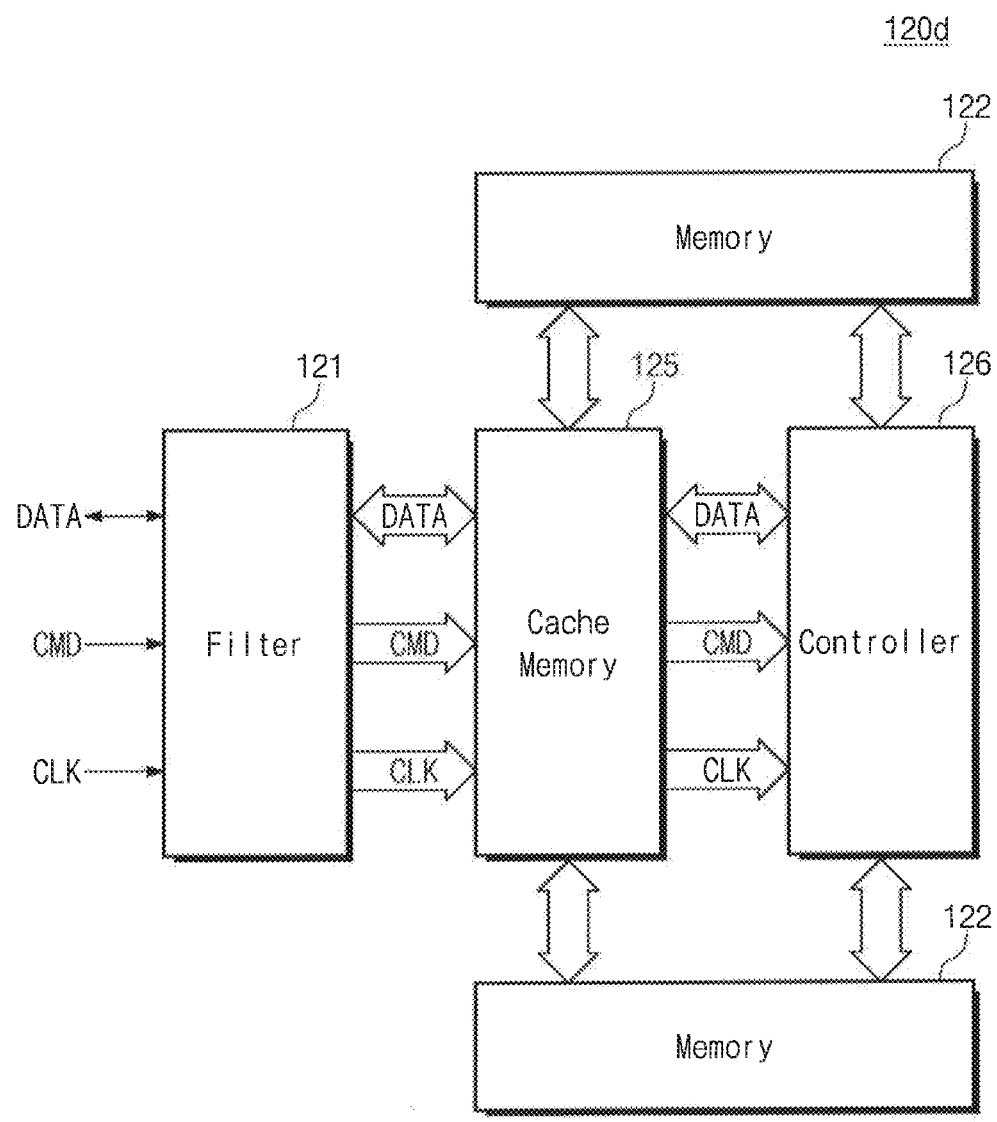
Figure 6:
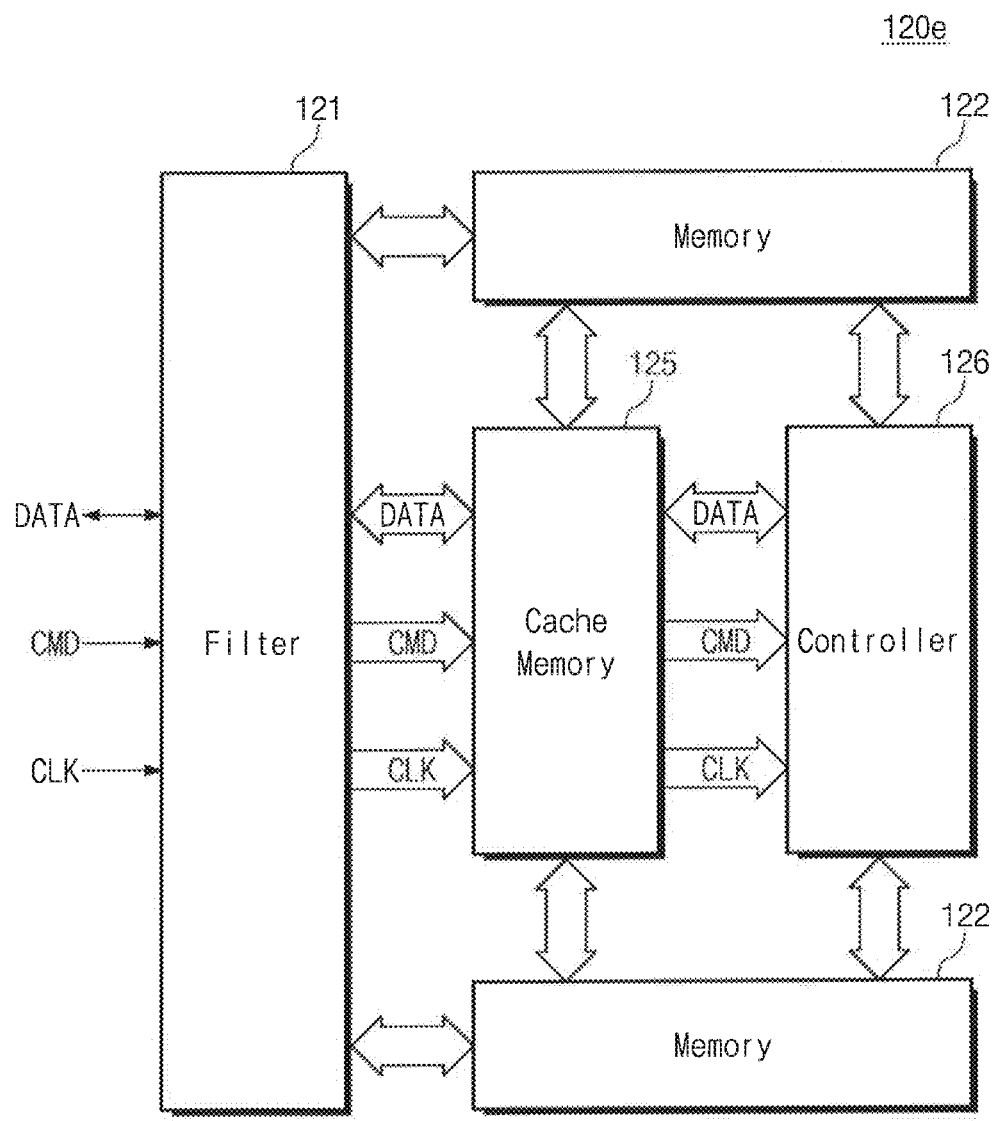

FIGS. 2 to 4 illustrate configurations of the first memory module 120 using volatile memory. FIG. 5 illustrates a configuration of the first memory module 120 using volatile and nonvolatile memory. FIG. 6 illustrates a configuration of the first memory module 120 using nonvolatile memory.

Referring to FIG. 2, the first memory module 120 of FIG. 1 may be an A-type memory module 120a having a UDIMM structure. The A-type memory module 120a may include the filter 121 and the memory device 122.

The filter 121 may be connected with the memory device 122 and the data bus 140. The memory device 122 may be connected with the data bus 140 through the filter 121. The memory device 122 may include a plurality of DRAMs.

In the UDIMM structure, when accessing the memory device 122, the host 110 may directly exchange data DATA, a clock CLK, and a command CMD with the memory device 122 through the filter 121. Operation of the A-type memory module 120a may be substantially the same as that of the first memory module 120, and thus a description thereof is omitted.

Referring to FIG. 3, the first memory module 120 of FIG. 1 may be a B-type memory module 120b having an RDIMM structure. The B-type memory module 120b may include the filter 121, the memory device 122, and a register clock driver (RCD) 123.

The filter 121 may be connected with the memory device 122, the data bus 140, and the RCD 123. The memory device 122 may be connected with the filter 121 and the RCD 123. To reduce the load of an output part of the host 110, the RCD 123 may buffer a clock CLK and a command CMD, which are to be transferred from the host 110 to the memory device 122.

In the RDIMM structure, when accessing the memory device 122, the host 110 may directly exchange data DATA with the memory device 122 through the filter 121. On the other hand, the host 110 may provide the clock CLK and the command CMD to the memory device 122 through the filter 121 and the RCD 123. Operation of the B-type memory module 120b may be substantially the same as that of the first memory module 120, and thus a description thereof is omitted.

Referring to FIG. 4, the first memory module 120 of FIG. 1 may be a C-type memory module 120c having an LRDIMM structure. The C-type memory module 120c may include the filter 121, the memory device 122, and a buffer 124.

The filter 121 may be connected with the buffer 124 and the data bus 140. The memory device 122 may be connected with the buffer 124. The buffer 124 may reduce the load of the output part of the host 110.

In the LRDIMM structure, when accessing the memory device 122, the host 110 may indirectly exchange data DATA, a clock CLK, and a command CMD with the memory device 122 through the filter 121 and the buffer 124. Operation of the C-type memory module 120c may be substantially the same as that of the first memory module 120, and thus a description thereof is omitted.

Referring to FIG. 5, the first memory module 120 of FIG. 1 may be a D-type memory module 120d including a nonvolatile memory. The D-type memory module 120d may include the filter 121, the memory device 122, a cache memory 125, and a controller 126.

The filter 121 may be connected with the cache memory 125 and the data bus 140. The memory device 122 may be connected with the cache memory 125 and the controller 126. The memory device 122 may perform read, write, and erase operations under control of the controller 126. Furthermore, the memory device 122 may exchange information with the cache memory 125. The memory device 122 may be one of the above-described nonvolatile memories.

The cache memory 125 may be connected with the filter 121, the memory device 122, and the controller 126. The cache memory 125 may be used as a working memory, a buffer memory, or a cache memory of the controller 126. The cache memory 125 may temporarily store information used for read and a write operations of the memory device 122. In other words, the cache memory 125 may reduce the difference between the processing speeds of the host 110 and the nonvolatile memory of the memory device 122. The cache memory 125 may include a DRAM.

The controller 126 may be connected with the memory device 122 and the cache memory 125. The controller 126 may control a write operation of the memory device 122 in response to a write command of the host 110. The controller 126 may also control a read operation of the memory device 122 in response to a read command from the host 110. Furthermore, the controller 126 may control operation of the cache memory 125.

Operation of the D-type memory module 120d is as follows. The D-type memory module 120d may be provided with read and write commands from the host 110. The filter 121 may pass a signal (e.g., a provided command), which has an operating frequency band of the D-type memory module 120d, from among the commands sent by the host 110. The provided command may be transferred to the controller 126 through the cache memory 125. The controller 126 may assign an address of the memory device 122 which will perform the provided command. Afterwards, the memory device 122 may execute the provided command with respect to the assigned address.

The D-type memory module 120d may include a DRAM and a nonvolatile memory which have the same capacity. In this structure, the DRAM may be used as a main memory device. In other words, the host 110 may be able to access only the DRAM and may not directly access the nonvolatile memory. The nonvolatile memory may act as a backup memory inside the D-type memory module 120d. Accordingly, the D-type memory module 120d may be substantially the same as a DRAM DIMM in terms of a relation with the host 110.

Referring to FIG. 6, the first memory module 120 of FIG. 1 may be an E-type memory module 120e including a nonvolatile memory. The E-type memory module 120e may include the filter 121, the memory device 122, the cache memory 125, and the controller 126.

The filter 121 may be connected with the memory device 122, the data bus 140, and the cache memory 125. The memory device 122 may be connected with the filter 121, the cache memory 125, and the controller 126. The memory device 122 may directly exchange data with the host 110 via the filter 121 (unlike the memory device 122 of FIG. 5). The memory device 122 may be one of the above-described nonvolatile memories. The cache memory 125 may be connected with the filter 121, the memory device 122, and the controller 126. The controller 126 may be connected with the memory device 122 and the cache memory 125.

The E-type memory module 120e may operate substantially the same as the D-type memory module 120d of FIG. 5, except the memory device 122 may directly exchange information with the host 110, and thus a description thereof is omitted.

The E-type memory module 120e may have a DIMM structure including only a nonvolatile memory. In other words, the E-type memory module 120e may be a memory module which uses the nonvolatile memory as a storage medium. Accordingly, the host 110 may access the nonvolatile memory. The above-described E-type memory module 120e may provide for large storage capacity, which a DRAM DIMM (e.g., the D-type memory module 120d) does not support. However, access speed of the above-described E-type memory module 120e may be slower than that of the DRAM DIMM.

In an exemplary embodiment of the inventive concept, the E-type memory module 120e may have a DIMM structure including a nonvolatile memory and a DRAM. In the E-type memory module 120e with such a structure, storage capacity of the nonvolatile memory may be smaller than that of the DRAM. The E-type memory module 120e may have two operating modes. In the first mode, the DRAM may be used as a main memory device and the nonvolatile memory may be used as a backup memory. In the second mode, the nonvolatile memory may be used as a storage medium and the DRAM may be used as a buffer memory for storage.

As described above with reference to FIGS. 2 to 6, the first memory module 120 may have a structure of one of the A-type to E-type memory modules 120a to 120e, using a nonvolatile memory and/or a volatile memory.

Referring back to FIG. 1, the second memory module 130 may also have a structure of one of the A-type to E-type memory modules 120a to 120e. However, the second memory module 130 may differ from the first memory module 120 in configuration or operating frequency. In an exemplary embodiment of the inventive concept, the second memory module 130 may include a plurality of memory modules. The second memory module 130 may operate substantially the same as the first memory module 120, and thus a description thereof is omitted.

The data processing device 100 according to an exemplary embodiment of the inventive concept may include a system with the first and second memory modules 120 and 130, which may be heterogeneous memory modules. Operation of the data processing device 100 will be described below.

Figure 7:
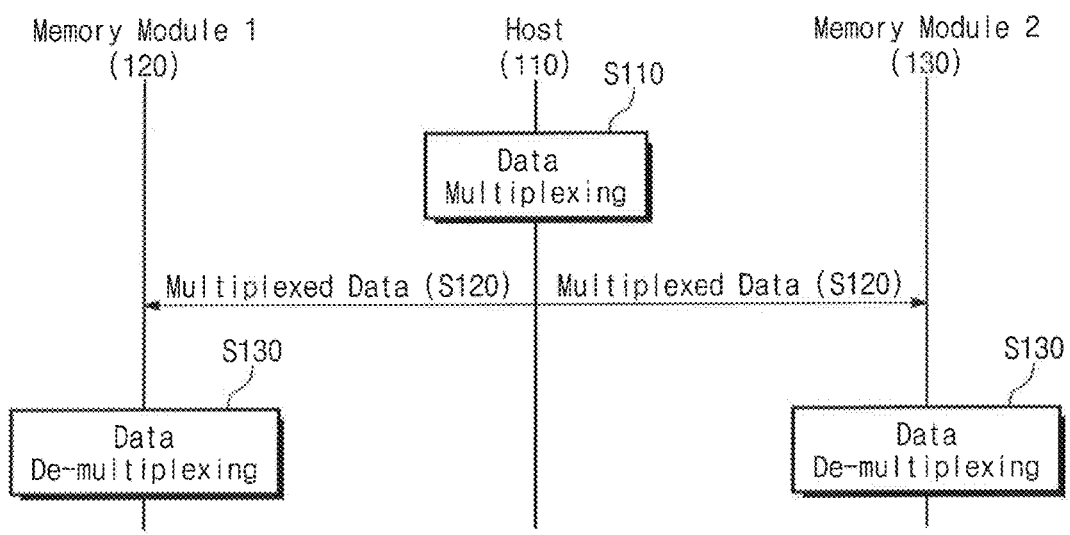
FIGS. 7 and 8 are flow charts illustrating a method of providing information between a host and memory modules of FIG. 1 according to an exemplary embodiment of the inventive concept.
Figure 8:
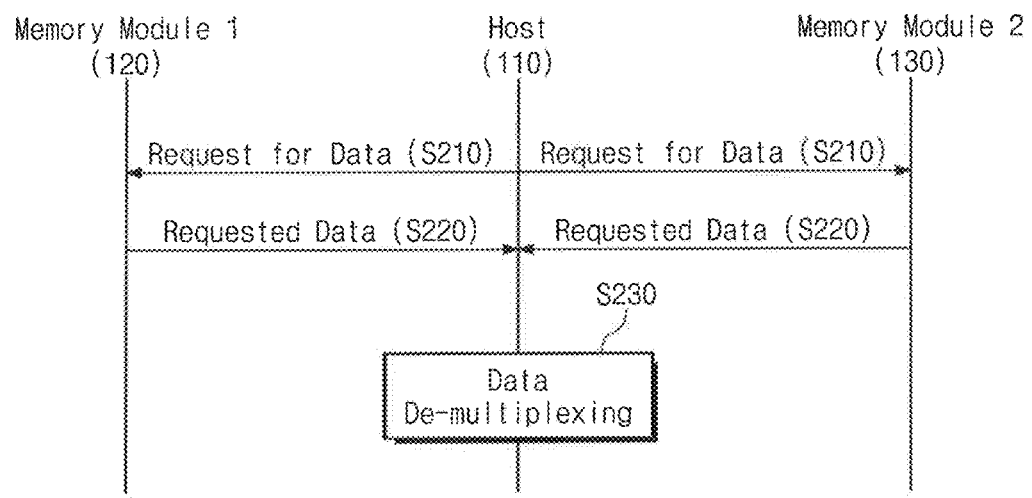

FIGS. 7 and 8 are flow charts illustrating a method of providing information between a host and memory modules of FIG. 1 according to an exemplary embodiment of the inventive concept.

Referring to FIGS. 1 and 7 together, the host 110 may provide information to the first and second memory modules 120 and 130, which operate at different reference frequencies, through one channel. As described above, the second memory module 130 may include a plurality of memory modules.

In step S110, the host 110 may prepare information to be provided to the first and second memory modules 120 and 130. Afterwards, the modulator 111 of the host 110 may generate a modulated signal by modulating the information with an operating frequency of a target memory module among the first and second memory modules 120 and 130. The host 110 may multiplex the modulated signal through the multiplexer 112 into a multiplexed signal.

In step S120, the host 110 may provide the multiplexed signal to the data bus 140. The multiplexed signal may be provided to the first and second memory modules 120 and 130 through the data bus 140.

In step S130, the filters 121 and 131 of the first and second memory modules 120 and 130, respectively, may receive the multiplexed signal provided through the data bus 140. Each of the filters 121 and 131 may pass signals which have an operating frequency band of a corresponding memory module. The memory devices 122 and 132 may be controlled by the host 110 through provided signals. In other words, the multiplexed signal, containing pieces of information generated from the host 110, may be demultiplexed by the filters 121 and 131 of the first and second memory modules 120 and 130, respectively. Consequently, only a target memory module may be controlled by the host 110.

Referring to FIGS. 1 and 8 together, the first and second memory modules 120 and 130 may simultaneously provide information to the host 110 through the data bus 140. As described above, the second memory module 130 may include a plurality of memory modules.

In step S210, the host 110 may request necessary information from the first and second memory modules 120 and 130. The request for the necessary information may be transferred to the first and second memory modules 120 and 130 through the data bus 140.

In step S220, the memory devices 122 and 132 of the first and second memory modules 120 and 130 may output the requested information. The requested information may be output as a signal to the data bus 140 through the filters 121 and 131. Afterwards, the signal passes through the data bus 140 to be provided to the host 110.

In step S230, each of the filters 113 of the host 110 may pass signals which have an operating frequency band of either the first and second memory modules 120 and 130. In other words, signals provided from the first and second memory modules 120 and 130 through the filters 113 may be demultiplexed. Afterwards, each of the demodulators 114 may demodulate a received signal to a signal of a frequency band which the host 110 is able to process. The host 110 may be provided with a demodulated signal from the demodulators 114.

According to an exemplary embodiment of the inventive concept, channels may be shared in a variety of combinations, which will be described below.

Information which is exchanged between the host 110 and the first and second memory modules 120 and 130 may be classified into data, a clock, a command, or an address. Pieces of information may be exchanged through specified channels. Below, signals which are exchanged between the host 110 and the first and second memory modules 120 and 130 during a read and a write operation of the host 110 will be described.

For the write operation, the host 110 may provide an active command and a row address to the first and second memory modules 120 and 130 with a clock. After a reference time, the host 110 may provide a write command and a column address to the first and second memory modules 120 and 130 with the clock. After another reference time, the host 110 may provide data to the first and second memory modules 120 and 130. The first and second memory modules 120 and 130 may write the provided data at a specific address.

For the read operation, the host 110 may provide an active command and a row address to the first and second memory modules 120 and 130 with the clock. After a reference time, the host 110 may provide a read command and a column address to the first and second memory modules 120 and 130 with the clock. After another reference time, the first and second memory modules 120 and 130 may provide requested data to the host 110.

According to an exemplary embodiment of the inventive concept, data, command, address, and clock channels may be shared by the first memory module 120 and the second memory module 130. Accordingly, exemplary embodiments of the inventive concept may be modified through different combinations of shared channels.

For example, a data channel of the first memory module 120 may be shared with at least one of a data channel, a command channel, an address channel, or a clock channel of the second memory module 130. A command channel of the first memory module 120 may be shared with at least one of the data channel, the command channel, the address channel, or the clock channel of the second memory module 130. An address channel of the first memory module 120 may be shared with at least one of the data channel, the command channel, the address channel, or the clock channel of the second memory module 130. A clock channel of the first memory module 120 may be shared with at least one of the data channel, the command channel, the address channel, or the clock channel of the second memory module 130.

According to an exemplary embodiment of the inventive concept, in the case where information is exchanged between the host 110 and the first and second memory modules 120 and 130, memory modules may convey information to be exchanged by modulating and demodulating the information to signals of different frequency bands. Accordingly, it may be possible to exchange information from different memory modules through one channel at the same time.

FIGS. 9 to 15 are block diagrams illustrating memory modules according to embodiments of the inventive concept.

With respect to the exemplary embodiments illustrated in FIGS. 9 to 15, each of first memory modules 220 to 820 may have a structure of one of the A-type to E-type memory modules 120*a* to 120*e*. Furthermore, all of the exemplary embodiments to be described later may be applied to the second memory module 130.

Figure 9:
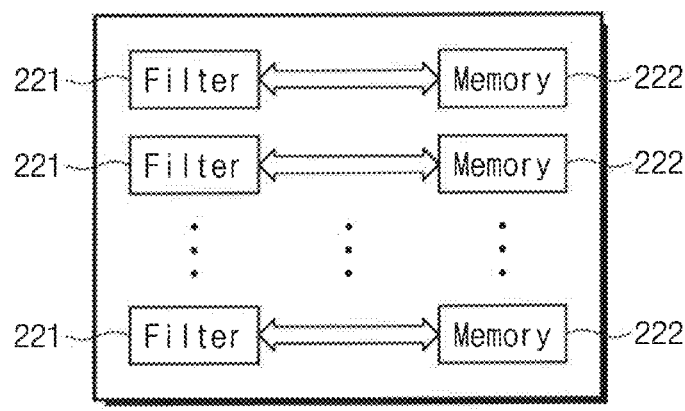
FIGS. 9 to 15 are block diagrams illustrating memory modules according to exemplary embodiments of the inventive concept.

Referring to FIG. 9, a first memory module 220, which corresponds to the first memory module 120 of FIG. 1, may include a plurality of filters 221 and a plurality of memory devices 222. The first memory module 220 may provide a device which allows the plurality of memory devices 222 and the host 110 to communicate with each other at the same time. The plurality of memory devices 222 may operate at different frequency bands. Each of the filters 221 may pass information of an operating frequency band of a corresponding memory device among the memory devices 222.

When the host 110 accesses the memory devices 222, the modulator 111 of the host 110 may modulate information with an operating frequency band of each of the memory devices 222. The host 110 may multiplex the modulated signal through the multiplexer 112. The multiplexed signal may be provided to the first memory module 220 through the data bus 140. The multiplexed signal provided from the host 110 may be demultiplexed through each of the filters 221. The signals demultiplexed through the filters 221 may be provided to corresponding memory devices 222, respectively. Consequently, the host 110 may provide information to the plurality of memory devices 222 at the same time.

When the memory devices 222 provide information to the host 110, operation is as follows. The memory devices 222 may be provided with a data output command from the host 110. The memory devices 222 may provide requested data to the data bus 140 through the filters 221 in synchronization with the data output command. The requested data may be provided as signals to the host 110 through the data bus 140. The filters 113 of the host 110 may demultiplex the provided signals based on operating frequencies of the memory devices 222. The demodulators 114 may demodulate the signals received from the filters 113 to signals of a frequency band which the host 110 is able to process. Consequently, the memory devices 222 may provide information to the host 110 at the same time.

According to an exemplary embodiment of the inventive concept, the host 110 may simultaneously communicate with the memory devices 222 with different frequency bands. Accordingly, it may be possible to manage memory endurance because of the quality of operations of the memory devices 222.

Figure 10:
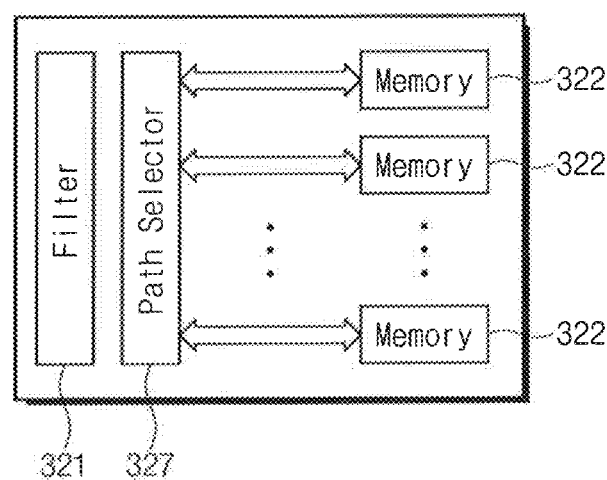

Referring to FIG. 10, the first memory module 320, which corresponds to the first memory module 120 of FIG. 1, may change a channel which is shared with the second memory module 130. The first memory module 320 may include a filter 321, a plurality of memory devices 322, and a path selector 327.

The path selector 327 may change a channel through which a signal is transferred. The path selector 327 may be set with setting information provided from the host 110. In an exemplary embodiment of the inventive concept, the path selector 327 may select a path in response to the setting information from the host 110 during a booting sequence operation. In an exemplary embodiment of the inventive concept, the path selector 327 may select a path in response to the setting information from the host 110 during an operation of the first memory module 320.

Thus, according to at least one exemplary embodiment, communication efficiency of the data processing device 100 may be improved by changing a combination of shared channels through the path selector 327.

The first memory module 320 may operate substantially the same as the first memory module 120 of FIG. 1, except a channel through which a signal is transferred may be changed by the path selector 327, and thus a description thereof is omitted.

Figure 11:
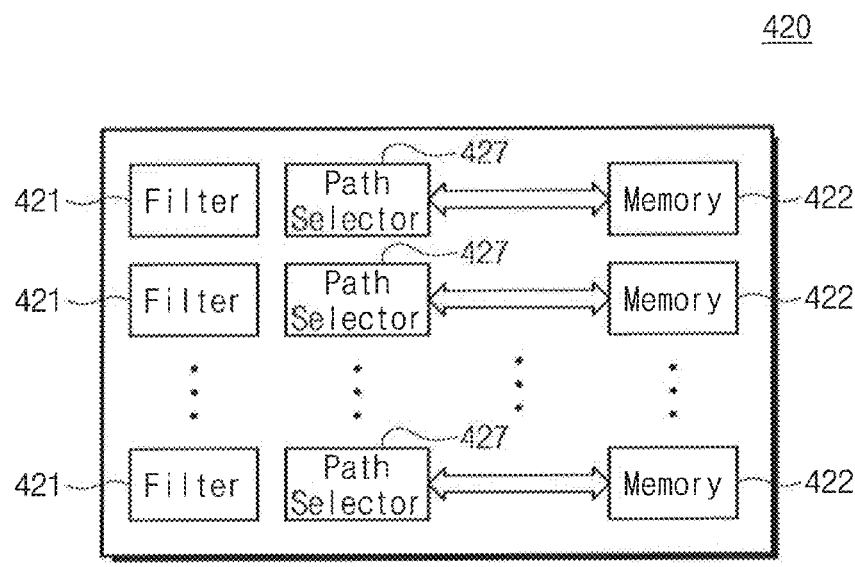

Referring to FIG. 11, a first memory module 420, which corresponds to the first memory module 120 of FIG. 1, may provide a device which allows a plurality of memory devices 422 and the host 110 to communicate with each other at the same time. In addition, using a plurality of path selectors 427, a channel of a memory device among the memory devices 422 may be changed to be shared with another memory device among the memory devices 422 or with the second memory module 130 by the path selector 427. The first memory module 420 may include a plurality of filters 421, the memory devices 422, and the plurality of path selectors 427.

Each of the path selectors 427 may be set with setting information provided from the host 110. In an exemplary embodiment of the inventive concept, each of the path selectors 427 may select a path in response to the setting information from the host 110 during a booting sequence operation. In an exemplary embodiment of the inventive concept, each of the path selectors 427 may select a path in response to the setting information from the host 110 during an operation of the first memory module 420.

The first memory module 420 may operate substantially the same as the first memory module 220 of FIG. 9, except a channel through which a signal is transferred may be changed by the path selectors 427, and thus a description thereof is omitted.

In the exemplary embodiments of the inventive concept illustrated in FIGS. 1 and 9-11, the host 110 modulates information to signals of the operating frequency bands of the first memory module 120, 220, 320, or 420 and the second memory module 130 for communication. Below, exemplary embodiments of the inventive concept will be described in which the host 110 modulates information to signals of frequency bands higher than the operating frequency bands of the first and second memory modules 120 and 130 for communication.

The reason to modulate information to a signal of a high-frequency band is that interference due to any other signal(s) at the high-frequency band is small. In other words, since interference from natural sources and interference from other communication signals is small at high frequency, noise may be decreased during transmission of signals.

Figure 12:
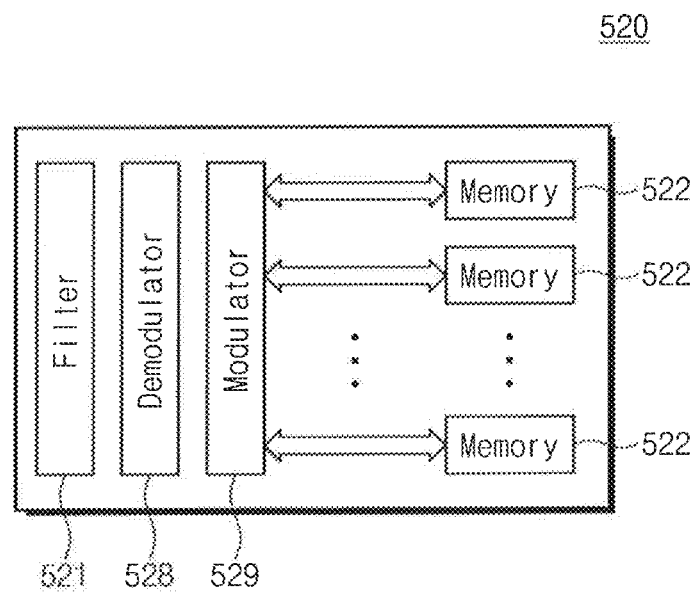

Referring to FIG. 12, a first memory module 520, which corresponds to the first memory module 120 of FIG. 1, may communicate with the host 110 using signals modulated to have different frequency bands. The first memory module 520 may include a filter 521, a plurality of memory devices 522, a demodulator 528, and a modulator 529.

The first memory module 520 may operate substantially the same as the first memory module 120 of FIG. 1, except a signal is modulated by the modulator 529 to have a high frequency and is demodulated by the demodulator 528 to an original signal.

When the host 110 accesses the first memory module 520, operation is as follows. The modulator 111 of the host 110 may modulate information to have a frequency band higher than an operating frequency band of the first memory module 520. The procedure for providing the modulated information as a signal from the host 110 to the first memory module 520 is substantially the same as that of FIG. 1, and thus a description thereof is omitted. The first memory module 520 may demodulate the provided signal to have an operating frequency band thereof. Afterwards, the first memory module 520 may be controlled by the demodulated signal.

When the first memory module 520 provides information to the host 110, operation is as follows. The host 110 may request information from the first memory module 520. The requested information may be provided to the modulator 529. The modulator 529 of the first memory module 520 may modulate information so as to have a frequency band higher than the operating frequency band of the first memory module 520. The modulated information may be provided to the host 110 through the data bus 140. Each of the filters 113 of the host 110 may demultiplex provided signals based on a modulation frequency of the first memory module 520. Afterwards, each of the demodulators 114 may demodulate received signals to a signal of a frequency band which the host 110 is able to process. The host 110 may then be provided with the demodulated signals.

Figure 13:
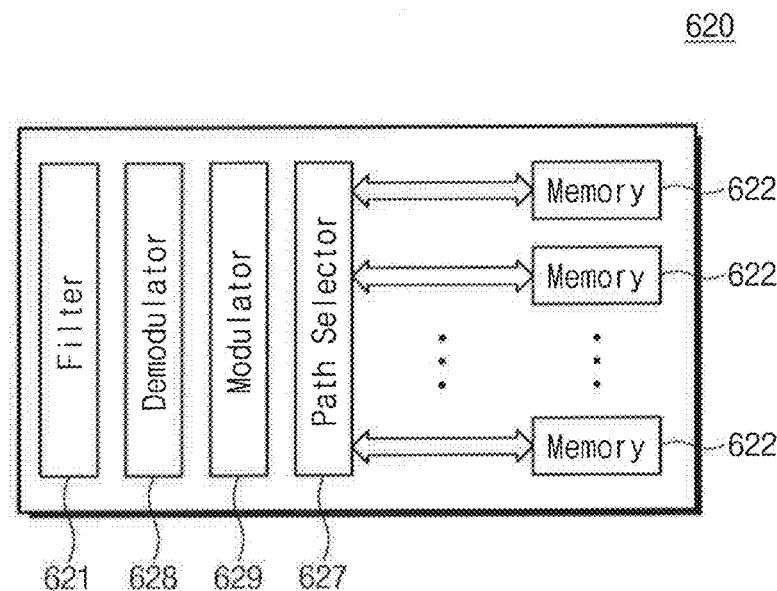

Referring to FIG. 13, a first memory module 620, which corresponds to the first memory module 120 of FIG. 1, may communicate with the host 110 using signals modulated to have a high-frequency band. In addition, the first memory module 620 may change a channel which is shared with the second memory module 130. The first memory module 620 may include a filter 621, a plurality of memory devices 622, a path selector 627, a demodulator 628, and a modulator 629.

The first memory module 620 may operate substantially the same as the first memory module 520 of FIG. 12, except a channel through which a signal is transferred may be changed by the path selector 627, and thus a description thereof is omitted.

Figure 14:
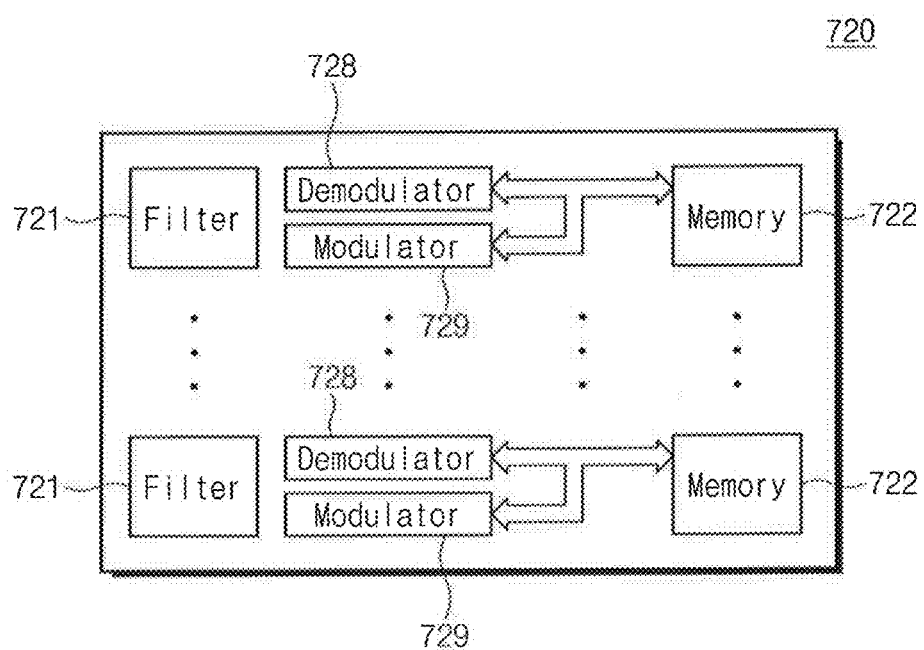

Referring to FIG. 14, a first memory module 720, which corresponds to the first memory module 120 of FIG. 1, may provide a device which allows a plurality of memory devices 722 and the host 110 to communicate with each other at the same time. In addition, the first memory module 720 may communicate with the host 110 using a signal modulated to have a high-frequency band. The first memory module 720 may include filters 721, the plurality of memory devices 722, a plurality of demodulators 728, and a plurality of modulators 729.

The first memory module 720 may operate substantially the same as the first memory module 220 of FIG. 9, except that a signal is modulated by each of the modulators 729 to have a high frequency and is demodulated by each of the demodulators 728 to an original signal, and thus a description thereof is omitted.

Figure 15:
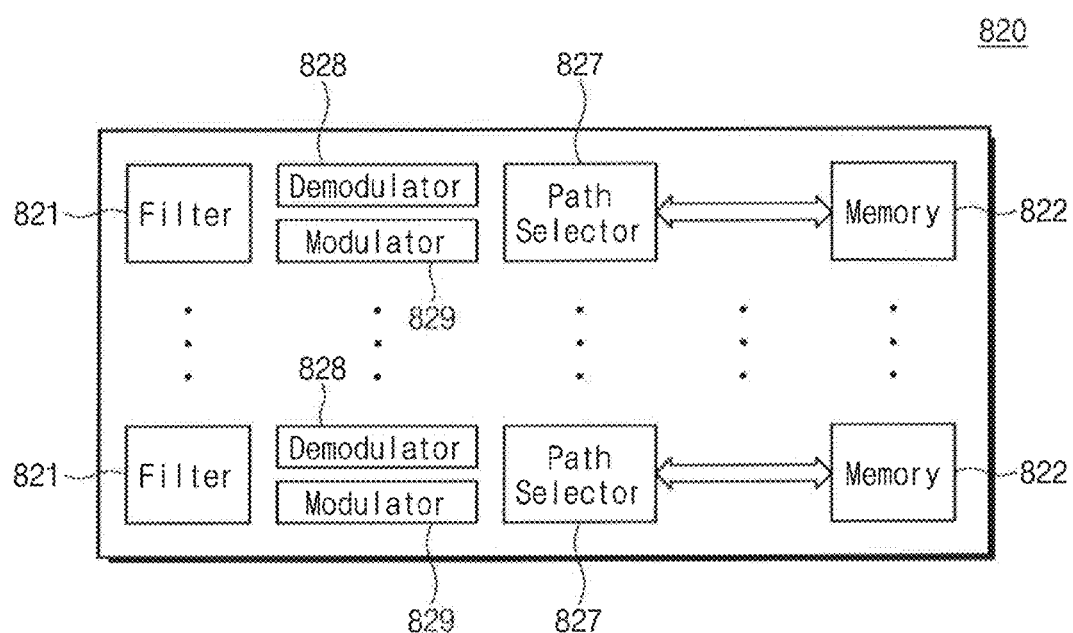

Referring to FIG. 15, a first memory module 820, which corresponds to the first memory module 120 of FIG. 1, may provide a device which allows a plurality of memory devices 822 and the host 110 to communicate with each other at the same time. Furthermore, the first memory module 820 may communicate with the host 110 using signals modulated to have a high-frequency band. In addition, using a plurality of path selectors 827, a channel of each of the memory devices 822 of the first memory module 820 may be changed to be shared with another memory device of the first memory module 820 or with the second memory module 130.

The first memory module 820 may include filters 821, the plurality of memory devices 822, the plurality of path selectors 827, a plurality of demodulators 828, and a plurality of modulators 829.

The first memory module 820 may operate substantially the same as the first memory module 720 of FIG. 14, except a channel through which a signal is transferred is changed by the path selectors 827, and thus a description thereof is omitted.

The configurations and operating principles of the above-described first memory modules 120 to 820 may be applied to the second memory module 130 of FIG. 1. In an exemplary embodiment of the inventive concept, the second memory module 130 of FIG. 1 may include a plurality of memory modules. An operating method of the data processing device 100 according to an exemplary embodiment of the inventive concept may be applied to communication between memory modules or to communication between memory devices.

According to an exemplary embodiment of the inventive concept, a host can simultaneously communicate with a plurality of memory modules of different operating frequencies. Accordingly, bandwidth decrease due to channel preoccupation by the memory modules may be reduced during communication between the host and the memory modules.

Furthermore, the memory modules may share a channel during communication. Consequently, the structure of a data processing device can be simplified because a bus preoccupation module between memory modules is not needed.

While the inventive concept has been shown and described with reference to exemplary embodiments thereof, it will be apparent to those of ordinary skill in the art that various changes in form and detail may be made without departing from the spirit and scope of the inventive concept as defined by the following claims.

What is claimed is:

1. A memory module, comprising:
   a memory device configured to operate with a clock of a reference frequency; and
   a filter configured to receive a multiplexed signal from a host and to filter a signal of a frequency band from the multiplexed signal,
   wherein the frequency hand comprises the reference frequency, and
   the signal of the frequency band is provided to the memory device.

2. The memory module of claim 1, wherein the multiplexed signal comprises at least one of data, a command, an address, or a clock signal transferred at the frequency band, and
   the data, the command, the address, and the clock signal are transferred to the filter through distinct signal paths.

3. The memory module of claim 1, further comprising:
   a demodulation device configured to demodulate signals passing through the filter and to transfer demodulated signals to the memory device.

4. The memory module of claim 1, further comprising:
   a path selector configured to change a path of a filtered first signal of the multiplexed signal to a path of a filtered second signal of the multiplexed signal in response to setting information from the host.

5. The memory module of claim 1, further comprising:
   a demodulation device configured to demodulate signals passing through the filter and to transfer demodulated signals to the memory device; and
   a path selector configured to change a path of a filtered first signal of the multiplexed signal to a path of a filtered second signal of the multiplexed signal in response to setting information from the host.

6. The memory module of claim 1, wherein the memory module is connected to the host and has a dual in-line memory module (DIMM) structure.

7. A memory module, comprising:
- a first memory device configured to operate with a clock of a first reference frequency;
- a second memory device configured to operate with a clock of a second reference frequency that is different from the first reference frequency;
- a first filter configured to receive a multiplexed signal from a host and to filter a signal of a first frequency band, comprising the first reference frequency, from the multiplexed signal; and
- a second filter configured to receive the multiplexed signal from the host and to filter a signal of a second frequency band, comprising the second reference frequency, from the multiplexed signal,
- wherein the signal of the first frequency band is provided to the first memory device and the signal of the second frequency band is provided to the second memory device.

8. The memory module of claim 7, wherein the multiplexed signal comprises at least one of first data, a first command, a first address, or a first clock signal transferred at the first frequency band, and
- the first data, the first command, the first address, and the first clock signal are transferred to the first filter through distinct signal paths.

9. The memory module of claim 8, wherein the multiplexed signal further comprises at least one of second data, a second command, a second address, or a second clock signal transferred at the second frequency band, and
- the second data, the second command, the second address, and the second clock signal are transferred to the second filter through distinct signal paths.

10. The memory module of claim 7, further comprising:
- a demodulation device configured to demodulate signals passing through the first filter or the second filter and to transfer demodulated signals to the first memory device or the second memory device.

11. The memory module of claim 7, further comprising:
- a first path selector configured to change a path of a first signal, passing through the first filter, of the multiplexed signal to a path of a. second signal, passing through the first filter, of the multiplexed signal, in response to setting information from the host.

12. The memory module of claim 11, further comprising:
- a second path selector configured to change a path of a third signal, passing through the second filter, of the multiplexed signal to a path of a fourth signal, passing through the second filter, of the multiplexed signal, in response to the setting information from the host.

13. The memory module of claim 7, further comprising:
- a demodulation device configured to demodulate signals passing through the first filter or the second filter and to transfer the demodulated signals to the first memory device or the second memory device;
- a first path selector configured to change a path of a first signal, passing through the first filter, of the multiplexed signal to a path of a second signal, passing through the first filter, of the multiplexed signal, in response to setting information from the host; and
- a second path selector configured to change a path of a third signal, passing through the second filter, of the multiplexed signal to a path of a fourth signal, passing through the second filter, of the multiplexed signal, in response to the setting information from the host.

14. The memory module of claim 7, wherein the memory module is connected to the host and has a dual in-line memory module (DIMM) structure.

15. The memory module of claim 7, wherein the first memory device or the second memory device comprises at least one of a dynamic random access memory (DRAM), a static random access memory (SRAM), a thyristor RAM (TRAM), a zero capacitor RAM (Z-RAM), a twin transistor RAM (TTRAM), a magnetoelectric RAM (MRAM), an electrically erasable programmable read-only memory (EEPROM), a flash memory, a spin-transfer torque MRAM (STT-MRAM), a conductive bridging RAM (CBRAM), a ferroelectric RAM (FeRAM), a phase change RAM (PRAM), a resistive RAM (RRAM), a nanotube RRAM (RRAM), a polymer RAM (PoRAM), a nano-floating gate memory (NFGM), a holographic memory, a molecular electronic memory device, or an insulator resistance change memory.

* * * * *